(12) United States Patent
Cops

(10) Patent No.: US 7,859,297 B1
(45) Date of Patent: Dec. 28, 2010

(54) IMPEDANCE CONVERSION IN DATA COMMUNICATION

(75) Inventor: Wim F. Cops, Le Rouret (FR)

(73) Assignee: Mindspeed Technologies, Inc., Newport Beach, CA (US)

( * ) Notice: Subject to any disclaimer, the term of this patent is extended or adjusted under 35 U.S.C. 154(b) by 0 days.

(21) Appl. No.: 12/360,151

(22) Filed: Jan. 27, 2009

(51) Int. Cl.
*H03K 17/16* (2006.01)
*H03K 19/003* (2006.01)

(52) U.S. Cl. .............................. 326/30; 326/32; 326/33
(58) Field of Classification Search .................. None
See application file for complete search history.

(56) References Cited

U.S. PATENT DOCUMENTS 5,264,744 A * 11/1993 Mizukami et al. ............. 326/62
6,448,813 B2 * 9/2002 Garlepp et al. ................ 326/83
2003/0234677 A1 * 12/2003 Atyunin et al. ............. 327/309

* cited by examiner

*Primary Examiner*—Anh Q Tran
(74) *Attorney, Agent, or Firm*—Thomas, Kayden, Horstemeyer & Risley, LLP

(57) ABSTRACT

Disclosed in various embodiments are a circuit and method for driving a signal. In one embodiment, the circuit includes a passive impedance conversion network and at least two signal drivers coupled to the passive impedance conversion network. Each of the signal drivers includes a signal input coupled to a common signal input node.

16 Claims, 1 Drawing Sheet

IMPEDANCE CONVERSION IN DATA COMMUNICATION

BACKGROUND

Signal drivers typically are connected to an external electrical medium such as cables, backplane traces, and other electrical media to create a data communication link. In the case where the output characteristic impedance of a driver circuit is different from the characteristic impedance of the medium, and impedance conversion is required to insure reliable operation. Typically, a mismatch in the output characteristic impedance of the driver circuit and the characteristic impedance of the medium would result in a severe limitation of the Bit Error Rate (BER), maximum attainable length of the link, and other problems. To ensure such a mismatch does not occur, current state of the art employs a signal driver with increased swing and a passive network. However, with scaling technologies, it is not always possible to produce a driver swing that is higher than the signal level measured at the external medium.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the disclosure. Moreover, in the drawings, like reference numerals designate corresponding parts throughout the several views.

DETAILED DESCRIPTION

Figure 1:
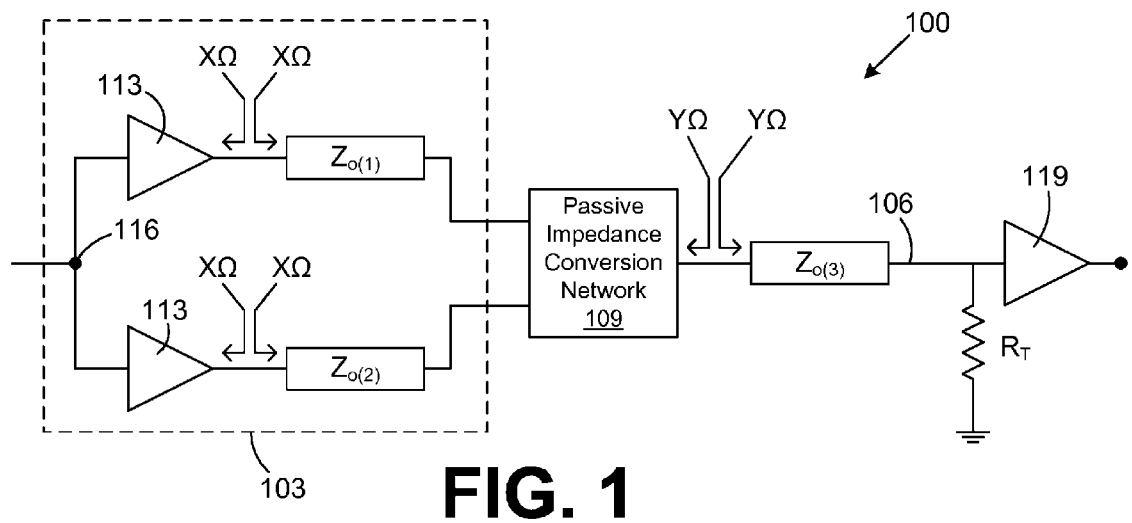
FIG. 1 is a drawing of a data communication circuit according to an embodiment of the present disclosure.

With reference to FIG. 1, shown is a circuit 100 that employs a driver circuit 103 to transmit a signal such as a data signal over a transmission medium 106 according to various embodiments. The transmission medium 106 may comprise, for example, cables, backplane traces, or other types of transmission media as can be appreciated. The driver circuit 103 includes a passive impedance conversion network 109 that provides for characteristic impedance conversion as will be described.

The driver circuit 103 also includes at least two or more signal drivers 113 that are connected in parallel in the driver circuit 103. Each of the signal drivers 113 includes a signal input that is coupled to a common signal input node 116. The circuit 100 also includes a termination resistance $R_T$ that couples the transmission medium 106 to ground. A further driver circuit 119 is employed to drive a signal that is applied to downstream circuits as can be appreciated. Although only two signal drivers 113 are shown in parallel, it is possible that three or more signal drivers 113 may be employed.

Associated with each of the signal drivers 113 is an output characteristic impedance $Z_{o(1)}$ and $Z_{o(2)}$ as shown. In addition, the transmission medium 106 has a characteristic impedance $Z_{o(3)}$.

The driver circuit 103 advantageously serves to transmit a signal across the transmission medium 106. Such a signal may comprise, for example, a data signal or other type of signal. To this end, the signal to be transmitted across the transmission medium 106 is applied to the common signal input node 116. This signal is applied to an input of each of the signal drivers 113 coupled to the common signal input node 116. The signal drivers 113 amplify the signal and transmit the same to the passive impedance conversion network 109.

The passive impedance conversion network 109 facilitates the matching of the characteristic impedance between the output impedances of the signal drivers 113 and the characteristic impedance of the transmission medium 106. To this end, the passive impedance conversion network 109 facilitates the transmission of the signal drivers 113 from the output of the signal drivers 113 to the transmission medium 106 without undue reflection or signal distortion due to a mismatch between the characteristic impedances $Z_{o(1)}$ and $Z_{o(2)}$ associated with the signal drivers 113 and the characteristic impedance $Z_{o(3)}$ associated with the transmission medium 106.

To this end, the characteristic impedances $Z_{o(1)}$ and $Z_{o(2)}$ may be different than the characteristic impedance $Z_{o(3)}$ of the transmission medium 106. Due to the fact that the signal drivers 113 are coupled in parallel, the signal applied to the common signal input node is independently driven by each of the signal drivers 113. To this end, the power of the signal applied to the transmission medium 106 at the output of the passive impedance conversion network 109 is multiplied by the number of signal drivers 113. Due to the multiplication of the power of the signal, the attenuation of the signal by the passive impedance conversion network 109 does not result in a diminished signal when it reaches the transmission medium 106 such that transmission over the transmission medium 106 is potentially impaired. Stated another, the boost to the signal due to the multiple signal drivers 113 ensures that the signal is of a nominal magnitude when it reaches the transmission medium 106.

This is accomplished without using a signal driver 113 with an expanded output voltage range that is much higher than the nominal operating voltage range of the signal applied to the common signal input node 116. Stated another way, each of the signal drivers 113 has an output voltage range that is substantially equal to a signal range associated with a signal that is driven by the driver circuit 103. Alternatively, the signal drivers 113 may have an output voltage range that is greater than a signal range associated with a signal to prevent saturation of the signal driver 113 when generating the signal.

According to one embodiment, the use of the multiple signal drivers 113 in parallel in conjunction with the passive impedance conversion network 109 facilitates transmission of a signal on the transmission medium 106 even though the output characteristic impedance $Z_{o(1)}$ and $Z_{o(2)}$ of the signal drivers 113 differs from the characteristic impedance $Z_{o(3)}$ of the transmission medium 106. To this end, for example, the characteristic impedance seen at the output of each of the signal drivers 113 may comprise, for example, X ohms as shown. In one example, the actual characteristic impedance may comprise 50 ohms at the outputs of the signal drivers 113, or some other value.

The characteristic impedance as seen from the transmission medium 106 looking back to the passive impedance conversion network 109 is Y ohms. For example, the characteristic impedance $Z_{o(3)}$ of the transmission medium 106 may comprise Y=75 ohms. To this end, the termination resistance $R_T$ may be equal to, for example, 75 ohms. The passive impedance conversion network 109 advantageously converts the 50 ohm characteristic impedances $Z_{o(1)}$ and $Z_{o(2)}$ into the characteristic impedance $Z_{o(3)}$ of the transmission medium 106. That is to say, the impedance seen at the output of the signal drivers 113 looking into the passive impedance conversion network 109 is equal to X Ohms, and the impedance seen from the transmission medium 106 looking back to the passive impedance conversion network 109 is Y Ohms. The passive impedance conversion network 109 accomplishes the impedance conversion without unwanted reflection and/or attenuation of the signal. Further, signal drivers 113 may be employed that do not have extended voltage output ranges that are beyond the range needed to generate the signal.

Since the signal drivers 113 operate in parallel to double the power of the signal received at the common signal input node 116, the signal is successfully transmitted onto the transmission medium 106 even though the signal drivers 113 have a voltage output range that is substantially equal to the range of the signal itself. Alternatively, the output voltage range of the signal drivers 113 may be greater than the signal transmitted.

Given that multiple parallel signal drivers 113 are employed to boost the power of the signal transmitted, then a greater amount of power is available to transmit the signal through the passive impedance conversion network 109 without undesirable attenuation before the signal reaches the transmission medium 106. This contrasts with driver circuits that employ a single signal driver 113 that includes a much higher voltage output range than the signal drivers 113 depicted in FIG. 1 so that such single signal driver 113 can successfully transmit the respective signal through an impedance conversion network without undue attenuation. Such single signal drivers 113 require power sources that generate higher voltages to ultimately allow the creation of a greater voltage output. In a sense, such single signal drivers 113 "over drive" the signal to compensate for attenuation of the signal in the impedance conversion network.

Advantageously, the signal drivers 113 may have a much reduced voltage signal output range as compared to driver circuits that employ a single signal driver 113, where the parallel signal drivers 113 facilitate the transmission of a signal through the passive impedance conversion network 109 without appreciable attenuation. As a consequence, the power sources that provide power to the signal drivers 113 provide a lower voltage than power sources employed to drive a single signal driver 113. Stated another way, the higher the voltage range at the output of a single signal driver 113, then there is more voltage headroom needed in the driver design, thus necessitating an increase in the supply voltage.

In the driver circuit 103, the parallel signal drivers 113 result in a lesser need for voltage headroom, thereby resulting in a decrease in the needed supply voltage. This is accomplished while, at the same time, the signal successfully passes through the passive impedance conversion network 109 and reaches the transmission medium 106 with a nominal signal level.

Figure 2:
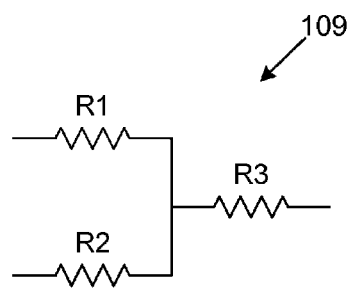
FIG. 2 is a drawing of a passive conversion network employed in the data communication circuit according to an embodiment of the present disclosure.

With reference then to FIG. 2, shown is one example of the passive impedance conversion network 109 according to an embodiment. It is understood that the passive impedance conversion network 109 of FIG. 2 provides one illustration of the various different configurations that may be employed for the passive impedance conversion network 109. As shown, the passive impedance conversion network 109 includes two parallel resistors $R_1$ and $R_2$ that are coupled in series with a series resistance $R_3$. The parallel resistances $R_1$ and $R_2$ are coupled to a respective one of the signal drivers 113 (FIG. 1). The series resistance $R_3$ is coupled to the transmission medium 106.

The values of the resistances $R_1$, $R_2$, and $R_3$ are selected so as to provide for proper impedance conversion between the signal drivers 113 and the transmission medium 106. For example, if it is assumed that the characteristic impedances $Z_{o(1)}$ and $Z_{o(2)}$ are both equal to 50 ohms, and the characteristic impedance $Z_{o(3)}$ of the transmission medium 106 is equal to 75 ohms, then the resistances $R_1$ and $R_2$ are specified as 10 Ohms, and the resistance $R_3$ is specified as 45 Ohms. This ensures that from the perspective of either of the signal drivers 113, the impedance of the transmission medium 106 is equal to 50 ohms. Also, from the perspective of the transmission medium 106 looking back into the passive impedance conversion network 109, the characteristic impedance is equal to 75 ohms. To solve for the resistances R1, R2, and R3 in the above example, we note that the impedance seen at the output of a respective one of the signal drivers 113 needs to be 50 Ohms. To this end, the resistance of 50 Ohms is equal to R1 plus the parallel resistance of (R2+50) and (R3+75). Similarly, the impedance seen at the transmission medium 106 looking back to the signal drivers 113 needs to be 75 Ohms. Accordingly, the resistance of 75 Ohms is equal to R3 plus the parallel resistance of (R1+50) and (R2+50). Finally, due to the symmetry of the circuit 100, R1 is equal to R2. From the foregoing, values may be determined for R1, R2, and R3. In the example above, R1=R2=10 Ohms, and R3=45 Ohms.

Although the various values of the various impedances and resistances are provided above in one example, it is understood that such impedances and resistances may differ from those described above. Further, the passive impedance conversion network 109 may be embodied in many different circuit configurations other than that shown above that achieve the same ultimate result of converting the characteristic impedances as described above.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, the following is claimed:

1. A circuit, comprising:
   a passive impedance conversion network;
   at least two signal drivers coupled to the passive impedance conversion network, wherein the at least two signal drivers simultaneously drive a signal;
   a common signal input node;
   each of the signal drivers having a signal input coupled to the common signal input node; and
   wherein the passive impedance conversion network further comprises a pair of parallel resistances, each parallel resistance being coupled to an output of a respective one of the signal drivers, wherein each parallel resistance is further coupled to a series resistance.

2. A circuit, comprising:
   a passive impedance conversion network;
   at least two signal drivers coupled to the passive impedance conversion network;
   a common signal input node;
   each of the signal drivers having a signal input coupled to the common signal input node;
   wherein a signal at the common signal input node is independently driven by each of the signal drivers, thereby multiplying a power of the signal applied to a medium at the output of the passive impedance conversion network; and
   wherein the passive impedance conversion network further comprises a pair of parallel resistances, each parallel resistance being coupled to an output of a respective one of the signal drivers, wherein each parallel resistance is further coupled to a series resistance.

3. The circuit of claim 1, wherein the each of the signal drivers has an output voltage range that is substantially equal to a signal range associated with a signal driven by the circuit.

4. The circuit of claim 1, wherein an output characteristic impedance of each of the signal drivers is different than a characteristic impedance of a medium coupled to an output of the passive impedance conversion network.

5. A method, comprising the steps of:
simultaneously driving a signal with at least two parallel signal drivers by applying the signal to a common signal node coupled to at least two signal inputs of the at least two parallel signal drivers;
applying at least two signal outputs of the at least two parallel signal drivers to a transmission medium through a passive impedance conversion network; and
performing an impedance matching between the parallel signal drivers and the transmission medium with the passive impedance conversion network, wherein the passive impedance conversion network comprises at least two parallel resistances coupled to a series resistance, wherein each one of the at least two signal outputs is applied to a respective one of the at least two parallel resistances.

6. A method, comprising the steps of:
driving a signal with at least two parallel signal drivers by applying the signal to a common signal node coupled to at least two signal inputs of the at least two parallel signal drivers;
applying at least two signal outputs of the at least two parallel signal drivers to a transmission medium through a passive impedance conversion network;
performing an impedance matching between the parallel signal drivers and the transmission medium with the passive impedance conversion network, wherein the passive impedance conversion network comprises at least two parallel resistances coupled to a series resistance, wherein each one of the at least two signal outputs is applied to a respective one of the at least two parallel resistances; and
multiplying a power of the signal applied to the medium at an output of the passive impedance network by driving the signal with each of the parallel signal drivers independently.

7. The method of claim 5, wherein the at least two parallel signal drivers drive the signal with an output voltage range that is substantially equal to a signal range associated with the signal.

8. The method of claim 5, wherein an output characteristic impedance of each of the parallel signal drivers is different than a characteristic impedance of a medium coupled to an output of the passive impedance conversion network.

9. A circuit, comprising:
at least two parallel signal drivers that simultaneously drive a signal;
a means for coupling the at least two parallel signal drivers to a transmission medium and for matching a characteristic impedance of at least two output conductors coupled to the at least two parallel signal drivers and the characteristic impedance of the transmission medium.

10. The circuit of claim 9, wherein the means for coupling the signal further comprises a passive impedance conversion network.

11. The circuit of claim 9, further comprising:
a common signal input node; and
each of the at least two parallel signal drivers having a signal input coupled to the common signal input node.

12. A circuit, comprising:
at least two parallel signal drivers;
a means for coupling the at least two parallel signal drivers to a transmission medium and for matching a characteristic impedance of at least two output conductors coupled to the at least two parallel signal drivers and the characteristic impedance of the transmission medium;
a common signal input node;
each of the at least two parallel signal drivers having a signal input coupled to the common signal input node; and
wherein a signal at the common signal input node is independently driven by each of the parallel signal drivers, thereby multiplying a power of the signal applied to the transmission medium.

13. The circuit of claim 9, wherein the each of the parallel signal drivers has an output voltage range that is substantially equal to a signal range associated with a signal driven by the signal driver circuit.

14. The circuit of claim 9, wherein an output characteristic impedance of each of the parallel signal drivers is different than a characteristic impedance of the transmission medium.

15. The circuit of claim 10, wherein the passive impedance conversion network further comprises a pair of parallel resistances, each parallel resistance being coupled to an output of a respective one of the parallel signal drivers.

16. The circuit of claim 15, wherein each parallel resistance is further coupled to a series resistance.

\* \* \* \* \*